US006651891B1

United States Patent
Zakel et al.

(10) Patent No.: US 6,651,891 B1
(45) Date of Patent: Nov. 25, 2003

(54) METHOD FOR PRODUCING CONTACTLESS CHIP CARDS AND CORRESPONDING CONTACTLESS CHIP CARD

(75) Inventors: Elke Zakel, Reinickestrasse 8, D-14612 Falkensee (DE); Rolf Aschenbrenner, Berlin (DE); Frank Ansorge, Berlin (DE); Paul Kasulke, Berlin (DE)

(73) Assignees: Elke Zakel, Falkensee (DE); Smart Pac GmbH - Technology Services, Nauen (DE)

( * ) Notice: Subject to any disclaimer, the term of this patent is extended or adjusted under 35 U.S.C. 154(b) by 0 days.

(21) Appl. No.: 09/530,339

(22) PCT Filed: Nov. 4, 1997

(86) PCT No.: PCT/EP97/06088

§ 371 (c)(1),
(2), (4) Date: Jun. 28, 2000

(87) PCT Pub. No.: WO99/23606

PCT Pub. Date: May 14, 1999

(51) Int. Cl.[7] .............................................. G06K 19/00
(52) U.S. Cl. ........................ 235/487; 235/451; 235/492
(58) Field of Search ................................ 235/441, 487, 235/492, 451; 361/737

(56) References Cited

U.S. PATENT DOCUMENTS

| | | | | |
|---|---|---|---|---|
| 4,931,629 A | * | 6/1990 | Frankfurt | 235/382 |
| 5,598,032 A | | 1/1997 | Fidalgo | 257/679 |
| 5,612,532 A | * | 3/1997 | Iwasaki | 235/492 |
| 5,640,306 A | * | 6/1997 | Gaumet et al. | 174/52.1 |
| 5,671,525 A | * | 9/1997 | Fidalgo | 235/488 |
| 5,809,633 A | * | 9/1998 | Mundigl et al. | 29/600 |
| 5,852,289 A | * | 12/1998 | Masahiko | 235/380 |
| 5,880,934 A | * | 3/1999 | Haghiri-Tehrani | 235/492 |
| 5,946,198 A | * | 8/1999 | Hoppe et al. | 257/531 |
| 6,049,463 A | * | 4/2000 | O'Malley et al. | 174/255 |
| 6,095,423 A | * | 8/2000 | Houdeau et al. | 235/487 |
| 6,209,790 B1 | * | 4/2001 | Houdeau et al. | 235/487 |
| 6,223,989 B1 | * | 5/2001 | Permingeat | 235/487 |
| 6,281,048 B1 | * | 8/2001 | Vere et al. | 438/118 |
| 6,404,644 B1 | * | 6/2002 | Ikefuji et al. | 361/737 |

FOREIGN PATENT DOCUMENTS

| | | | |
|---|---|---|---|
| DE | 44 41 122 C1 | 12/1995 | G06K/19/077 |
| DE | 44 24 396 A1 | 1/1996 | G06K/19/077 |
| DE | 196 39 902 A1 | 12/1997 | G06K/19/077 |
| EP | 0 671 705 A2 | 2/1995 | G06K/19/077 |
| EP | 0 682 321 A2 | 5/1995 | G06K/19/077 |
| EP | 0 682 321 A3 | 5/1995 | G06K/19/077 |
| EP | 0 706 152 B1 | 10/1995 | G06K/19/077 |
| EP | 0 706 152 A3 | 10/1995 | G06K/19/077 |
| EP | 0 706 152 A2 | 10/1995 | G06K/19/077 |
| WO | WO 97/02662 | 1/1997 | H04B/1/58 |
| WO | WO 97/26620 | 7/1997 | G06K/19/077 |
| WO | WO 97/34247 A2 | 9/1997 | |
| WO | WO 97/34247 A3 | 9/1997 | G06K/19/077 |

* cited by examiner

Primary Examiner—Michael G. Lee
Assistant Examiner—Steven S. Paik
(74) Attorney, Agent, or Firm—Glenn Patent Group; Michael A. Glenn

(57) ABSTRACT

The present invention relates to a method of producing a contactless chip card. In a first step of the method, a card body with one or a plurality of recesses on one card body side is produced from a theremoplastic material, preferably by injection moulding. Bumps being formed on the base surface of the recesses. Subsequently, conductor tracks corresponding to a coil as a conductor track pattern are impressed directly onto surface areas of the card body side including the recesses using a hot impressing technique. The conductor tracks are impressed especially also onto surface areas inside the recesses such that same extends across the bumps. One or a plurality of chips are then aligned in the recesses and contacted with the conductor tracks in the recesses which extend across the bumps. The method according to the present invention is advantageous insofar as it permits a simple production of a chip card, which requires only a few method steps and is therefore also economical. Furthermore, such a chip card is both mechanically stable and reliable, since it comprises very few individual layers and since the conductor tracks of the coil are applied directly to the card body.

22 Claims, 2 Drawing Sheets

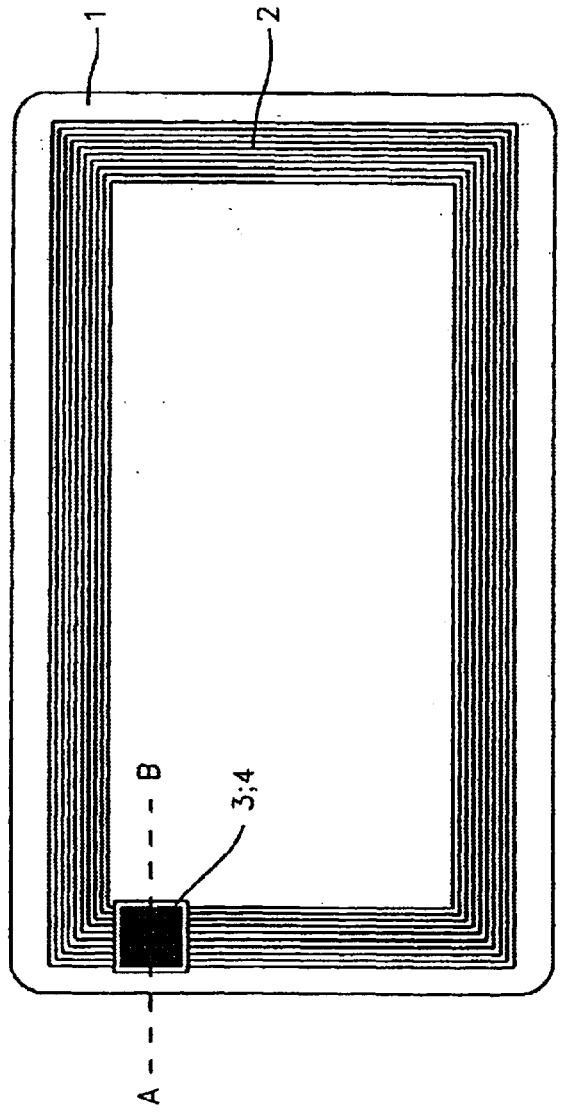
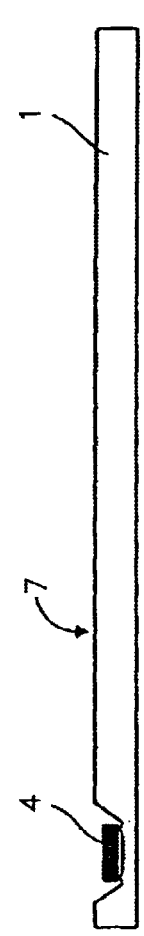
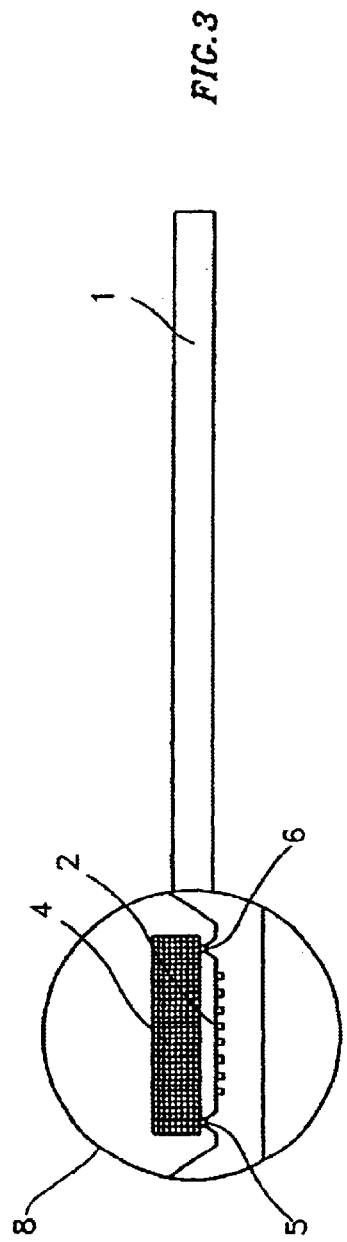
FIG. 1
FIG. 2
FIG. 3

METHOD FOR PRODUCING CONTACTLESS CHIP CARDS AND CORRESPONDING CONTACTLESS CHIP CARD

This application is a U.S. National Stage of International application PCT/EP97/06088, filed Nov. 4, 1997 in the German Language.

BACKGROUND OF THE INVENTION

1. Field of the Invention

The present invention relates to a method of producing contactless chip cards including at least one chip and to a contactless chip card.

A great number of chip cards is nowadays already used in all fields of private and public life. Their efficiency can be increased still further by using modern integrated circuits, since by implementing application-specific functions in the chip the field of application of chip cards can be extended to the following fields exceeding the sphere of identification and telecommunications: in the public health service e.g. by the insured person's card, the patient's data card and the emergency card. In the field of communication, chip cards can be used for controlling access to communication networks and for service payments as well as for data encryption and data protection. In payment transcations chip cards are very suitable to be used as cheque cards, credit/debit cards, electronic purses and for charge accounting for local traffic and on toll roads. In addition, chip cards are well suited for access control and identification purposes, e.g. for pay TV, leisure time services or production control.

At present, integrated storage circuits as well as microcontrollers are used for chip cards. Furthermore, cryptocontrollers having provided therein an encryption key or an encryption algorithm are used for chip cards. The data exchange is carried out by means of the contact surfaces with a reader or contactless by capacitive or inductive transmission. The efficiency of modern chip card systems requires a continuously increasing complexity and necessitates an increasing degree of integration. Initially, only memories with a minimum periphery were used, but now there is also a development towards more complex systems necessitating a microcontroller with a great variety of different functions and coils for contactless communication.

2. Description of Prior Art

In the case of the known contactless chip cards one or a plurality of coils, which are connected to the chip, are integrated in the card body. The energy and the data are transmitted by capacitive or inductive coupling. For producing this chip card, the so-called "inlet technique" is used. According to this technique, the coil and the chip are applied to a plastic carrier and fixed thereon. This carrier is then integrated in the actual chip card. This can be done by enclosing the carrier with the chip card material by injection moulding or by laminating it. After assembling the carrier and the card, the carrier constitutes an integral component of the chip card.

As is generally known, carrier foils are used as carriers on which wound, etched or printed coils are formed. In the case of wound coils, a backlack wire is wound so as to form a coil and is then connected to the chip. Disadvantages of this method are primarily the difficult application of the coil to the chip card and the connections between the thick wires of the coil and the naked chip.

In comparison with such wound coils, the etched and printed coils on the carrier foil offer the advantage that the conductor tracks are an integral component of the carrier foil. The chip is then connected to the coil by wire bonding or by means of the flip-chip technique. Subsequently, the carrier foil provided with the coil and the chip is integrated in the card body. Disadvantages of this method are the high production costs of the coil and the difficulties which have to be overcome when the whole card body is laminated. The lamination is, moreover, disadvantageous with regard to the thermal and the mechanical stability and, consequently, with regard to the service life of the chip card. In particular, the temperatures prevailing when the carrier is enclosed with the chip card material by injection moulding have a negative effect on the function of the expensive semiconductor chips. Furthermore, mistakes in the injection moulding process, i.e. mistakes in a comparatively economy-priced plastic component, will have the effect that the card including the expensive semiconductor chip becomes a reject.

DE 44 41 122 discloses e.g. a method for producing contactless chip cards in the case of which a foil material of approx. 50 $\mu$m thickness is coated with electrolytic copper which is used for producing therefrom an antenna coil with connecting areas by means of photoetching. Furthermore, the foil material is provided in a stamping process with an indented chip reception area and a stepped connection zone following this chip reception area. The chip is then secured in position in this reception area by means of an adhesive and its pads are connected to the connecting areas of the antenna winding by means of bonding wires. Following this, the thus equipped foil is stuck on both sides thereof between two plastic layers of identical thickness, with the exception of the chip reception area; these plastic layers are formed as cups around the chip reception area by means of approximately symmetric recesses. This method requires, however, an additional stamping process for the chip reception area and a complicated laminating and coating process.

WO 97/26620 discloses a chip card body for producing a chip card including a coil, the chip card body being provided with a recess having a chip arranged therein. The coil metallization extends in the form of a conductor track across the surface of the chip card body and through the recess, the chip being arranged in the recess in areas in which the conductor track does not extend through the recess. Pads of the chip are in electrical contact with the conductor track via bonding wires. Furthermore, it is suggested according to this publication that direct contacting of the chip by means of the bump technique should be used.

SUMMARY OF THE INVENTION

It is the object of the present invention to provide a contactless chip card and to further develop a method for producing a contactless chip card in such a way that the chip card, primarily the coil, can be produced in a simple and economy-priced manner and is both mechanically stable and reliable.

According to a first aspect of the invention, this object is achieved by a method of producing a contactless chip card comprising the following steps:

producing an electrically insulating, planar card body provided with at least one recess on one of its main surfaces, bumps being formed on the base surface of the recess;

applying at least one conductor track according to a predeterminable conductor track pattern to the main surface including the at least one recess, at least one conductor track being applied to surface areas outside of the at least one recess as well as to surface areas within the at least one recess, and the at least one conductor track extending across the bumps; and aligning at least one chip in the at least one recess and contacting the at least one chip with the at least one conductor track extending across the bumps.

According to a second aspect of the present invention, this object is achieved by a contactless chip card formed of an electrically insulating, one-piece card body comprising:

at least one recess provided on a main surface of the card body, the base surface of the recess having bumps formed thereon;

at least one conductor track according to a predetermined conductor track pattern, said at least one conductor track being applied directly to surface areas of the card body main surface including the at least one recess outside of said at least one recess as well as to surface areas within said at least one recess, and the at least one conductor track extending across the bumps; and at least one chip which is arranged in said at least one recess and which is contacted with the at least one conductor track in the area in which the at least one conductor track extends across the bumps.

In the method according to the present invention, an electrically insulating card body provided with one or a plurality of recesses on one card body side is first produced. Subsequently, at least one conductor track according to a predeterminable conductor track pattern is applied directly to the surface of the card body side including at least one recess. Following this, one or a plurality of chips or electronic components are aligned in at least one of these recesses and connected to the conductor tracks in an electrically conductive manner.

According to the present invention, bumps are used for contacting the chips. These bumps are preferably formed from the card-body plastic material simultaneously with the application of the conductor tracks according to the conductor track pattern, e.g. by the shape of the embossing punch, and they are provided with a metallization layer by means of one of the impressed conductor tracks.

Bumps also have the advantage that they can be used for adjusting a minimum distance to the (base) surface in the recesses, whereby the risk of destroying the chip when the chip is being aligned and contacted is substantially reduced. In addition, it is then not necessary that this distance control is carried out by the contacting means.

In one embodiment of the present invention, the card body provided with one or a plurality of recesses is produced in a single operating step. This is preferably done by means of injection moulding, whereby the card body will be implemented as a one-piece component. Materials that can be used for this purpose are preferably thermoplastic materials, e.g. PVC, ABS (acrylonitrile-butadiene styrene) or polycarbonates.

In a further embodiment, the conductor tracks are applied according to a predeterminable conductor track pattern to the surface of the card side including at least one recess, the conductor tracks being applied to surface areas outside of the recesses as well as to surface areas within at least one of these recesses. This is preferably done in a single operating step, the conductor tracks being impressed according to a predetermined pattern on the surface areas, especially also on surface areas within at least one of the recesses, by application of pressure and temperature.

The use of a heated embossing punch, e.g. a steel printing block, having the conductor track pattern applied thereto as a relief, is particularly suitable for this purpose. By means of this punch conductor tracks are punched out of a conductor foil, e.g. a copper foil, according to the conductor track pattern and simultaneously impressed on the surface of the card body side including the recesses.

According to a preferred embodiment of the present invention, the conductor tracks are caused to adhere to the card body surface by means of a layer of adhesive provided on the lower side of the conductor foil, the adhesive material being adapted to the temperature and the pressure during the impressing process in an advantageous manner. According to a preferred embodiment of the present invention, both the production of the card body, which is preferably carried out by injection moulding with a thermo-plastic material, and the application of at least one conductor track according to a conductor track pattern to the card body surface including the recesses or depressions are performed in a single operating step. Due to this minimum of production steps, a particularly economy-priced production and, consequently, a production of high numbers of pieces can be realized. An additional advantage is the high mechanical and thermal stability, since, firstly, the card comprising the card body and the card body provided with conductor tracks is formed of very few layers (minimum two layers: one-piece card body, layer of conductor tracks) and, secondly, the conductor tracks are applied directly to the one-piece and consequently mechanically and primarily thermally stable card body. According to one embodiment of the present invention, the conductor track pattern is implemented as a coil which functions like an antenna for the contactless transmission of energy and/or data.

The recesses and depressions incorporated in the card body have the advantage that they permit the chips to be installed in the so-called naked-chip mounting process. Naked-chip mounting means that the naked chip, i.e. the unhoused chip, is installed. If a chip with a housing were installed, the chip would project above the recess due to the markedly greater height of the housed chip and would therefore entail a great variety of disadvantages.

Preferably, the depth of the recesses is chosen such that the unhoused chips contacted to the impressed conductor tracks do not project above the depression. In one embodiment of the present invention, the pads required for mounting the chip are impressed or formed simultaneously with the application of the conductor tracks. These pads are therefore an integral component of the conductor tracks impressed according to a conductor track pattern.

The present invention can be used in a very flexible manner. Depending on the respective field of use of the card, the pad geometries which often vary according to the field of use can be realized in a simple manner and, depending on the arrangement of these pads, the most suitable contacting technique for the chips can be used, e.g. the wire bonding technique, glueing or the flip-chip technique. The flip-chip technique additionally offers the advantage of requiring little space.

According to a further embodiment, the recesses provided with chips are filled with an encapsulating material, e.g. a plastic material or a resin, for protecting the chip against environmental influences and for increasing the service life of the card in this way. In the case of conventional card thicknesses, the use of unhoused chips will then have the effect that the contacted chips do not project above the recess and that, when the recess has been filled with an encapsulating material, each chip will be hermetically sealed and the card surface including the recess will show neither any depressions nor any raised portions.

Another embodiment includes the method step that the card body side which is not provided with recesses has applied a label thereto. This label can, for example, be applied by printing and/or it can be formed from the card body material by embossing and, if desired, it can be dyed with different colours.

Preferably, the method step of applying the label is carried out after the production of the card body with the recesses, but before the conductor tracks according to the conductor track pattern are applied. The application of a label prior to contacting the chips offers the great advantage that a heat load, a chemical load and/or a mechanical load, such as e.g. pressure, bending, torsion, entailed by the application of a lable are avoided. In principle, the label can, however, also be applied after mounting of the chip on the conductor tracks. According to a further embodiment, the conductor track pattern is designed in such a way that and the recesses are positioned in such a way that there will a sufficient amount of space for applying a label also on the card surface including the recesses outside of these recesses and outside of the conductor tracks which are to be applied or which have been applied according to the conductor track pattern.

A particularly advantageous embodiment of the present invention is an embodiment in which the card body is provided with a label during the injection moulding process, whereby a one-piece card body with an integrated label will be obtained. This will at least have the effect that an otherwise necessary method step for labelling can be dispensed with, and is therefore an especially economy-priced course of action.

Further advantages of the method according to the present invention and of the chip card according to the present invention are referred to hereinbelow.

The present invention permits on the basis of very few method steps the production of a card body which includes at least one recess, especially by injection moulding the card body by means of thermoplastic materials, and which has a structured metallization applied to the card surface including the recess. This allows a simple and economy-priced production of cards in high numbers of pieces. In addition, the chip cards produced according to the present invention are characterized by a high mechanical stability and reliability. This is due to the small number of layers of which the chip card consists and it is due to the fact that the conductor tracks are directly applied to the one-piece card body according to a conductor track pattern, especially a coil. Hence, problems caused by incompatible materials will not arise in the case of the chip card according to the present invention. Furthermore, it is not necessary to use an intermediate carrier for the coil in this kind of chip card. Another advantage is the possibility of using the flip-chip technique for contacting the chip, which means that the advantages of a simple sequence of process steps and of a small overall height can be utilized. Moreover, a wire-bondable metallization is not necessary in this case. A further advantage is that the expensive and sensitive chips are incorporated in the card body only in a very late method step and are therefore exposed to detrimental thermal, chemical and physical loads to a much lesser degree by the few method steps which may perhaps be carried out afterwards. In particular, the chips are not exposed to the thermal load of an injection-moulding process according to the present invention. This guarantees, in the. final analysis, a lower reject rate and a higher reliability as well as a longer service life of the cards produced.

BRIEF DESCRIPTION OF THE DRAWINGS

Making reference to respective embodiments, the present invention will be described in the following on the basis of drawings, in which:

FIG. 1 shows a top view of a chip card 1 (surface including the recess) with a coil 2 with ten coil windings and a chip 4 embedded in a recess 3, FIG. 2 shows a side view of the chip card 1 according to FIG. 1 (section parallel to the longer card edge through the recess 3; section A–B), FIG. 3 shows an enlarged detail of the recess 3 with a contacted chip 4 according to FIG. 2.

Figure 4:
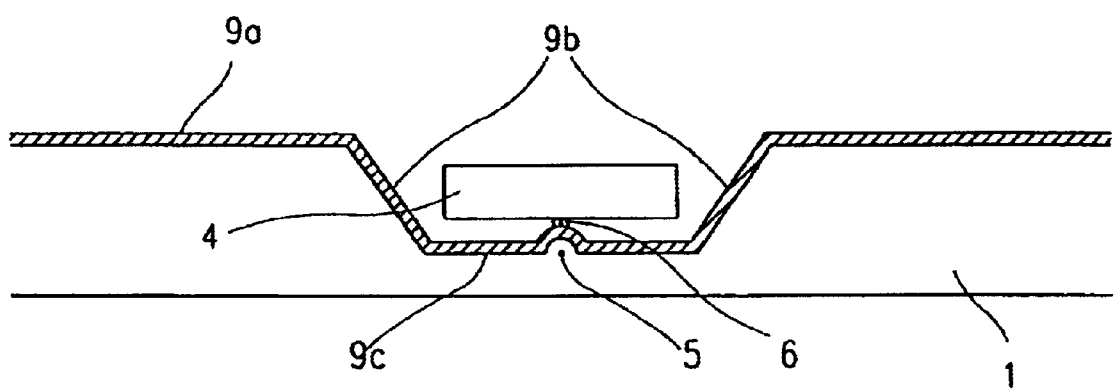
FIG. 4 shows an enlarged detail of the cross-sectional representation of the recess 3 with a contacted chip 4, the plane of section being orthogonal to the plane of section according to FIG. 3 and the card body surface including the recess.

DESCRIPTION OF PREFERRED
EMBODIMENTS OF THE INVENTION

In one embodiment, the chip card 1 includes precisely a single recess 3 in which a square chip 4 is aligned and contacted with the conductor tracks of the coil 2. The shape and the size of the recess has been adapted to the shape of the chip. From FIG. 2 it can be seen that the depth of the recess has been chosen such that the contacted chip is fully submerged in the recess, i.e. it does especially not project above the card surface 7. FIG. 3 shows an enlarged sectional view 8 of the recess area of the chip card, the plane of section being orthogonal to the conductor tracks (conductor tracks extending in the direction of the normal vector of the sectional area). The bumps 5 formed from the card body material 1, the material 6 used for actual contacting, an adhesive or a solder, and the conductor tracks of the coil 2 are clearly visible in this cross-sectional view. FIG. 4 shows a cross-sectional view through the recess with an impressed coil, the plane of section being orthogonal to the plane of section of FIG. 3 and the card surface including the recess and extending through the bump 5. From FIG. 4 it can be seen that the selected conductor track 9 of the coil is impressed without any interruption on the card surface outside of the recess 9a onto the lateral inclined surfaces of the recess 9b and on the (base) surface of the recess 9c. At the location of the bump 5, the conductor track 9 extends across the bump 5 thus causing a metallization of the bump 5.

In the case of one embodiment of the method according to the present invention for producing a contactless chip card, a card with a single depression or recess is produced in a first step by injection moulding making use of the plastic material polycarbonate. Subsequently, a label can be printed on the back of the card, i.e. the side or surface of the card which does not include any depression (nor any raised portions). In an additional step for producing the card, a hot embossing foil, which is formed of a copper layer on a carrier foil, is used for embossing the conductor tracks according to a conductor track pattern on the surface of the card body side including the recess (card surface including the recess), the conductor tracks being especially embossed on the recess (MID technique: formation of conductor tracks on a three-dimensionally structured substrate; MID: Molded Interconnect Device). Typical temperatures and pressure application times used for this purpose are approx. 130° C. to 150° C. for a few seconds. The pads of the embossed conductor tracks in the depression of the card have now dispensed thereon an isotropic-conductive adhesive. Outside of the pads, a further electrically non-conductive adhesive is dispensed onto at least part of the surface in the depression for fixing the chip. Following this, the chip is inserted in the depression, aligned and bonded. For protecting the chip against environmental influences, the depression including the bonded chip is filled with an encapsulating material (Glob Top). If desired, an additional layer, e.g. a layer of sealing material, is applied to the filled depression as a sort of cover. This multi-layer technique has the advantage that the desired properties can be adjusted more purposefully and more efficiently by choosing suitable encapsulating materials.

What is claimed is:

1. A method of producing a contactless chip card comprising the steps of:
   producing an electrically insulating, planar card body provided with at least one recess on one of its main surfaces, bumps being formed on the base surface of the recess;
   applying at least one conductor track according to a predetermined conductor track pattern to the one of its main surfaces including the at least one recess, at least one conductor track being applied to surface areas outside of the at least one recess as well as to surface areas within the at least one recess, and the at least one conductor track extending across the bumps and the bottom of the at least one recess; and
   aligning at least one chip in the at least one recess and contacting the at least one chip with the at least one conductor track extending across the bumps and the bottom of the at least one recess.

2. The method according to claim 1, wherein the bumps are formed integrally with the card body from the card body material, the card body being produced in a single operating cycle.

3. The method according to claim 1, wherein the card body is produced by injection moulding.

4. The method according to claim 1, wherein the card body side which is not provided with recesses has applied a label thereto.

5. The method according to claim 1, wherein the at least one conductor track is applied in a single operating cycle.

6. The method according to claim 1, wherein the application of the at least one conductor track is effected by applying pressure and temperature.

7. The method according to claim 6, wherein a heated embossing punch is used for applying pressure and temperature.

8. The method according to claim 1, wherein the chip is contacted by means of a flip-chip technique.

9. The method according to claim 1, wherein the chip (4) is contacted by means of an adhesive.

10. The method according to claim 1, wherein a coil is used as a conductor track pattern.

11. The method according to claim 1, wherein a thermoplastic material is used as a material for the card body.

12. The method according to claim 1, wherein, simultaneously with the application of the at least one conductor track to the at least one recess, the bumps are formed in form of plastic bumps and are provided with a metallization layer by the at least one condu6tor track.

13. The method according to claim 1, wherein the at least one recess into which the chips contacted to the at least one conductor track are inserted is filled with an encapsulating material, e.g. a plastic material or a resin.

14. The method according to claim 1, wherein, prior to contacting the chips, the card body is provided with a label.

15. A contactless chip card formed of an electrically insulating, one-piece card body comprising:
   at least one recess provided on a main surface of the card body, the base surface of the recess having bumps formed thereon;
   at least one conductor track according to a predetermined conductor track pattern, said at least one conductor track being applied directly to surface areas of the card body main surface including the at least one recess outside of said at least one recess as well as to surface areas within said at least one recess, and the at least one conductor track extending across the bumps and the bottom of the at least one recess; and
   at least one chip which is arranged in said at least one recess and which is contacted with the at least one conductor track in the area in which the at least one conductor track extends across the bumps and the bottom of the at least one recess.

16. The contactless chip card according to claim 15, wherein the bumps are formed integrally with the card body from the card body material.

17. The contactless chip card according to claim 15, wherein the at least one chip is contacted with the at least one conductor track by means of a flip-chip technique.

18. The contactless chip card according to claim 15, wherein the depth of the at least one recess is chosen such that the at least one contacted chip does not project above said at least one recess.

19. The contactless chip card according to claim 15, wherein the at least one recess is filled with an encapsulating material.

20. The contactless chip card according to claim 19, wherein the at least one recess is filled with an encapsulating material in such a way that the at least one chip is hermetically sealed.

21. The contactless chip card according to claim 15, wherein the at least one recess is filled with an encapsulating material in such a way that the card body main surface including the recess shows neither any raised portions nor any depressions.

22. The contactless chip card according to claim 15, wherein the material of the card body is a thermoplastic material, such as PVC, ABS or polycarbonate.

* * * * *